United States Patent [19]
Park et al.

[11] Patent Number: 5,842,075
[45] Date of Patent: Nov. 24, 1998

[54] DEVELOPING SOLUTION FEED SYSTEM FOR SEMICONDUCTOR PHOTOLITHOGRAPHY PROCESS HAVING A GAS REMOVAL DEVICE IN A HIGH SOLUTION FEED PRESSURE PIPE SECTION

[75] Inventors: Sung-hyeon Park, Suwon; Sung-il Kim; Jung-kyu Lee, both of Seoul, all of Rep. of Korea

[73] Assignee: Samsung Electronics Co., Ltd., Suwon, Rep. of Korea

[21] Appl. No.: 928,529

[22] Filed: Sep. 12, 1997

[30]      Foreign Application Priority Data

Sep. 13, 1996 [KR]    Rep. of Korea ................. 1996 39906

[51] Int. Cl.$^6$ ............................. G03D 5/04; B08B 3/04
[52] U.S. Cl. ................. 396/611; 396/565; 396/627; 134/84; 134/110; 134/902
[58] Field of Search ..................... 396/611, 626, 396/627, 565; 134/84, 85, 58 R, 193, 198, 902, 110

[56]            References Cited
             U.S. PATENT DOCUMENTS 5,301,701   4/1994   Nafziger ................... 134/902
5,542,441   8/1996   Mohindra et al. ............ 134/902
5,678,116  10/1997   Sugimoto et al. ............ 396/611
5,722,442   3/1998   Hoffman et al. ............. 134/902

*Primary Examiner*—A. A. Mathews
*Attorney, Agent, or Firm*—Jones & Volentine, L.L.P.

[57]            ABSTRACT

A developing solution feed system for a semiconductor photolithography process feeds the developing solution while removing any gas contained in the solution at a high solution feed pressure. The developing solution feed system has a plurality of feed tanks and a developing solution feed line having a plurality of first connecting pipes, each connected to the feed tanks, a second connecting pipe connected to the first connecting pipe to be converged into one passage, and a plurality of third connecting pipes branching out from the second connecting pipe. The system also contains nozzles connected to the third connecting pipes to thereby sputter the developing solution onto wafers each located in process chambers, a gas removal device installed in the one passage of the second connecting pipe to thereby remove gas contained in the developing solution, and shut off valves, each installed in the third connecting pipes to thereby open and close passages, so that the developing solution can selectively be fed into only one process chamber at a time through the third connecting pipes.

12 Claims, 2 Drawing Sheets

DEVELOPING SOLUTION FEED SYSTEM FOR SEMICONDUCTOR PHOTOLITHOGRAPHY PROCESS HAVING A GAS REMOVAL DEVICE IN A HIGH SOLUTION FEED PRESSURE PIPE SECTION

BACKGROUND OF THE INVENTION

1. Field of the Invention

This invention relates to a developing solution feed system for a semiconductor photolithography process and, more particularly, to a system in which gas contained in the developing solution is removed, and clear solution is fed onto the upper side of a wafer to thereby remove extraneous portions of a photoresist (PR) layer formed on the wafer.

2. Background of the Related Art

Generally, a semiconductor device is produced by repeatedly performing the processes of photolithography, diffusion, etching, evaporation and metal lining. In particular, the photolithography process is a process for forming a predetermined pattern on the wafer. The process includes the steps of forming a photoresist (PR) layer on the surface of the wafer, imprinting or exposing a reticle pattern having a predetermined layout on the PR layer, and removing extraneous portions of the layer by feeding the developing solution onto the wafer through a nozzle, to thereby form the desired pattern on the wafer.

In the above feed system, if the developing solution fed onto the wafer contains gas, the resulting pattern will be improperly formed on the wafer. Therefore, a gas removal device is installed in the developing solution feed system to remove gas contained in the solution.

FIG. 1 schematically shows a conventional developing solution feed system for a semiconductor photolithography process. The developing solution feed system 10 includes a main tank 12 for storing the developing solution, a plurality of feed tanks 16 for storing a predetermined quantity of developing solution fed from the main tank 12 through a feed pipe 14, a developing solution feed line 18 connected to the feed tanks, and nozzles 22 connected to ends of the developing solution feed line 18 and installed in process chambers 20.

In the developing solution feed line 18, each one of a plurality of first connecting pipes 24 are connected to each one of the plurality of feed tanks 16 for storing a predetermined quantity of developing solution. A second connecting pipe 26 has one end connected to the first connecting pipes 24 to be converged into one passage. The other end of the second connecting pipe 26, which forms the one passage, is connected to and branches off into a plurality of third connecting pipes 28. The third connecting pipes 28 extend into the nozzles 22, each installed in one of the process chambers 20.

Control valves 30a are installed in the first connecting pipes 24 connected to the feed tanks 16. The control valves 30a selectively shut off the flow of the developing solution. That is, the control valves 30a, operated by air for example, selectively shut off either of the first connecting pipes 24 to thereby leave open one pipe or the other.

The developing solution, fed through the first connecting pipe 24 opened by the control valve 30a, flows through the second connecting pipe 26, which has one end connected to the first connecting pipes 24, as well as through the third connecting pipes 28, and is thereby fed onto wafers 32 through the nozzles 22.

The third connecting pipe 28 successively includes gas removal devices 34 for removing gas contained in the developing solution flowing through the third connecting pipe 28, scale gauges 36 for gauging the quantity of developing solution flowing through the third connecting pipe 28, filters 38 for removing any foreign substance contained in the developing solution, and shut off valves 30b to selectively shut off the flow of developing solution fed to the nozzles 22.

FIG. 2 is a partially cutaway view showing the gas removal device 34 installed in the developing solution feed line of FIG. 1. The gas removal device 34, installed in the third connecting pipe 28, is molded of an epoxy and encloses bundles of nearly ten thousand capillary tubes 40, each having a diameter of 100–300 $\mu$m.

FIG. 3 is a partially cutaway detailed view of the capillary tube 40. The developing solution flows along the inside of a membrane forming the capillary tube at a feed pressure, while a high degree of vacuum is maintained on the outside of the membrane with a vacuum pump (not shown).

The capillary tube 40 is formed with projections 44 protruding into the inside of the membrane 42. The membrane 42 of the capillary tube 40 has hydrophobic properties so that gas can permeate the membrane 42 while the liquid developing solution cannot permeate the membrane.

Therefore, a gas partial pressure is generated by the developing solution feed pressure formed on the inside of the membrane 42 and the vacuum pressure formed on the outside of the membrane by the vacuum pump, so that gas contained in the developing solution passes through the membrane as the developing solution flows through the capillary tube 40.

To remove gas contained in the developing solution, the solution has to pass through the gas removal device 34 with feed pressure. This feed pressure is formed by feeding pressurized nitrogen gas into the feed tanks 16. The pressurization will be described as shown in the formula below:

$$P = \lambda \times (W^2/2\ g) \times (L/D)$$

where P is a developing solution feed pressure, $\lambda$ is a coefficient of friction, $W^2$ is an average speed, g is a gravitation constant, and L is a length and D is a diameter, respectively, of the capillary tube 40.

In the above formula, it can be easily appreciated that the developing solution feed pressure is directly proportional to the length L, but inversely proportional to the diameter D of the gas removal device.

However, in the conventional developing solution feed system, the developing solution is simultaneously fed into the respective processing chamber 20 from the plurality of third connecting pipes 28. Therefore, the developing solution feed pressure from the pressurized nitrogen gas in the feed tanks 16 is reduced when the developing solution passes from the single opening of second connecting pipe 26 to the plurality of third connecting pipes 28.

As a result, since the developing solution passes through the gas removal device with reduced feed pressure, gas removal efficiency of the gas removal device deteriorates. Any gas which may be present in the developing solution is not sufficiently removed, so when the developing solution is fed into each process chamber, process inferiorities result.

Also, a reduction in the developing solution feed pressure also reduces the quantity of developing solution fed onto the wafer during a fixed amount of time, so the time necessary to feed the required quantity of developing solution is longer, and the total developing process time becomes longer.

Moreover, in the conventional developing solution feed system, since the gas removal device and the filter each are installed in the third connecting pipes 28, installation expenses for the system increase, and the system becomes more difficult to run and maintain properly.

SUMMARY OF THE INVENTION

The feed system of the present invention elevates gas removal efficiency related to the developing solution feed pressure so as to prevent process inferiorities caused by the gas contained in the developing solution delivered to the wafer.

The present invention further provides a developing solution feed system for a semiconductor photolithography process in which the developing solution feed time and the developing process time are reduced so that the efficiency of the system can be increased.

The present invention also provides a developing solution feed system for a semiconductor photolithography process in which the number of required gas removal devices is decreased. As a result, installation expenses of the system can be reduced and maintenance can be easily performed.

The developing solution feed system of the present invention comprises a plurality of feed tanks for storing a predetermined quantity of developing solution and a developing solution feed line. The developing solution feed line has a plurality of first connecting pipes, each connected to the feed tanks, a second connecting pipe connected to the first connecting pipes to be converged into one passage, and a plurality of third connecting pipes branching off from the second connecting pipe.

The developing solution feed system also comprises: nozzles, each installed in the third connecting pipes of the developing solution feed line, to thereby sputter the developing solution onto wafers in a processing chamber; a gas removal device, installed in the second connecting pipe of the developing solution feed line to thereby remove gas contained in the developing solution; and shut off valves, each installed in the passage of the third connecting pipes to thereby selectively feed the developing solution into one process chamber at a time through the third connecting pipe.

BRIEF DESCRIPTION OF THE ATTACHED DRAWINGS

The accompanying drawings illustrate a particular embodiment of the invention in which:

FIG. 1 schematically shows a conventional developing solution feed system for a semiconductor photolithography process;

DETAILED DESCRIPTION OF PREFERRED EMBODIMENT

Reference will now be made in detail to the preferred embodiment of the present invention, an example of which is illustrated in the accompanying drawings.

Figure 1:
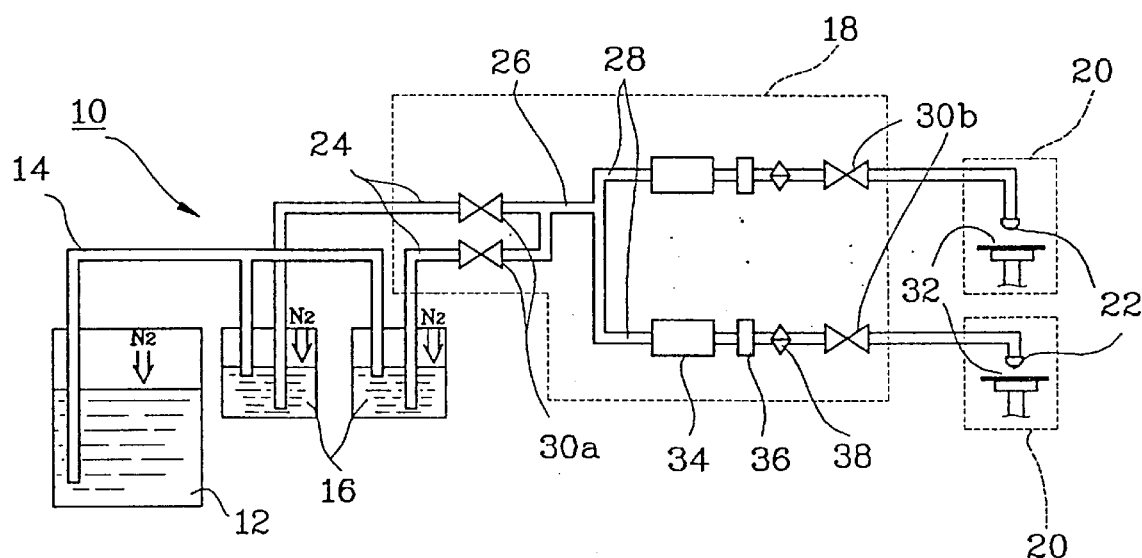
Figure 2:
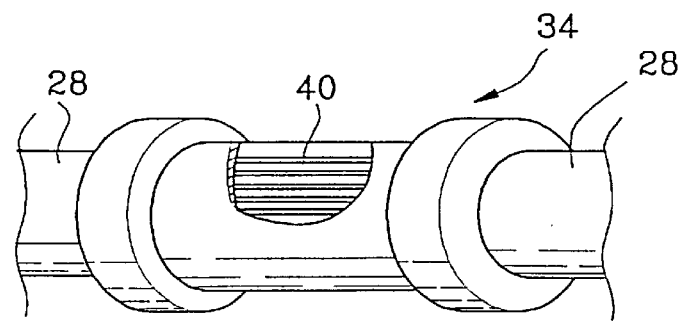
FIG. 2 is a partially cutaway perspective view showing a gas removal device installed in a developing solution feed line of the developing feed system of FIG. 1.
Figure 3:
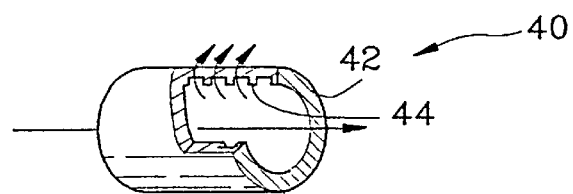
FIG. 3 is an enlarged partially cutaway perspective view showing a capillary tube located in the gas removal device of FIG. 2.
Figure 4:
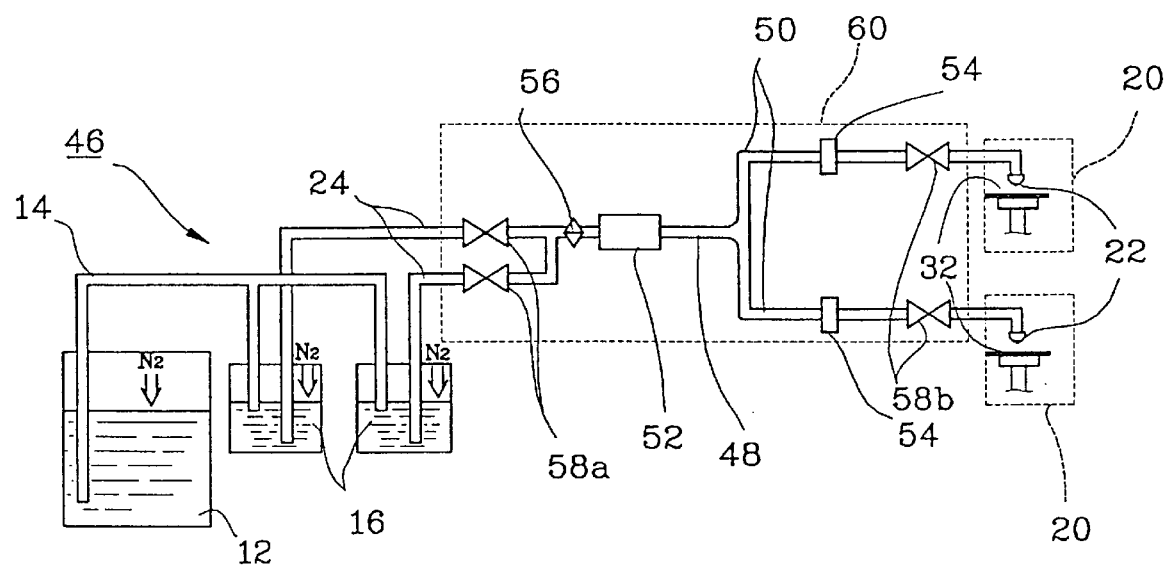
FIG. 4 schematically shows a developing solution feed system of a semiconductor photolithography process according to a preferred embodiment of the present invention.

As illustrated in FIG. 4, the developing solution feed system 46 is equipped with a plurality of feed tanks 16 for storing a predetermined quantity of developing solution. The feed tanks 16 are connected with a main tank 12 by feed pipes 14 to receive developing solution from main tank 12.

The feed tanks 16 feed the developing solution onto wafers 32 located in process chambers 20 through a developing solution feed line 60. The developing solution feed line 60 comprises a plurality of first connecting pipes 24, each one connected to one of the feed tanks, a second connecting pipe 48 connected to the first connecting pipes 24 to be converged into one passage, and a plurality of third connecting pipes 50 branching off from the one passage which forms the end of second connecting pipe 48.

In the developing solution feed line 60, the third connecting pipes 50 each have one end located in a process chamber 20 and equipped with a nozzle 22 for sputtering the developing solution onto the wafer 32. A gas removal device 52 is installed in the one passage section of second connecting pipe 48 to remove gas contained in the developing solution flowing through the passage. Thus, the developing solution, in which any gas is removed by the gas removal device 52, is fed into each process chamber 20 through the third connecting pipes 50 branching off from the second connecting pipe 48.

Control valves 58a are installed in the first connecting pipes 24 to thereby selectively shut off the flow of developing solution fed from the feed tanks 16. The control valves 58a may be operated by air, for example. It is desirable that the control valves 58a function to feed the developing solution from the one feed tank 16 having the largest quantity of developing solution among the feed tanks 16.

In addition, shut off valves 58b are installed in the third connecting pipes 50 to thereby selectively shut off the flow of developing solution fed to the nozzles 22 via the gas removal device 52.

The shut off valves 58b function to feed the developing solution only into one process chamber 20 through one of the third connecting pipes 50. That is, if any one shut off valve 58b is opened, all other shut off valves 58b are automatically closed.

The inventive developing solution feed line 60 is equipped with a filter 56 for removing any foreign substance from the developing solution and scale gauges 54 for measuring the flow of the developing solution.

As illustrated in FIG. 4, it is most desirable that the filter 56 is installed in the second connecting pipe 48 before the gas removal device 52, so that filtered developing solution can flow into the gas removal device 52. Also, the filter 56 may be installed in the first connecting pipes 24.

Furthermore, the filter 56 may be installed in the second connecting pipe 48 downstream of the gas removal device 52 so that the developing solution, in which the contained gas is removed by the gas removal device 52, can be filtered. Also, the filter 56 may be installed in the third connecting pipes 50.

As illustrated in FIG. 4, it is most desirable that the scale gauges 54 are respectively installed between the gas removal device 52 and the shut off valve 58b to thereby accurately gauge the quantity of the developing solution supplied to the wafers 32. Also, a single scale gauge may be installed in the second connecting pipe 48.

In the developing solution feed system of FIG. 4, the developing solution is fed from the main tank 12 into the feed tanks 16 and then into the nozzles 22 through the developing solution feed line 60 to thereby be sputtered onto the wafers 32.

Since the inventive gas removal device 52 is installed in the second connecting pipe 48 of the developing solution feed line 60, and the developing solution passes through the gas removal device 52 in a condition where the developing solution feed pressure is maintained at a high level and is not reduced, the gas removal efficiency rises. Also, since the developing solution, from which the contained gas is removed by the gas removal device 52, is fed onto the wafers 32, process inferiorities caused by gas contained in the developing solution can be prevented.

In addition, since the filter 56 is installed before the gas removal device 52, and the developing solution from which any foreign substance is removed by the filter is fed into the gas removal device 52, the foreign substance does not settle in the gas removal device 52. Thus, the function of the gas removal device is improved and its life span is maximized.

Moreover, when one of shut off valves 58b, installed in the third connecting pipes 50, is opened the other valve is automatically closed, so that the developing solution is fed into only one process chamber 20 through the third connecting pipe 50 at a time. Thus, the developing solution feed pressure is not reduced but remains high, to thereby sufficiently and quickly feed the solution to the process chamber. As a result, the developing process time can be shortened.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A developing solution feed system for a semiconductor photolithography process, comprising:

a plurality of feed tanks for storing a predetermined quantity of developing solution;

a developing solution feed line having a plurality of first connecting pipes, each connected to said feed tanks, a second connecting pipe connected to the first connecting pipes to be converged into one passage, and a plurality of third connecting pipes branching off from said one passage of the second connecting pipe;

a plurality of nozzles, each connected to said third connecting pipes of the developing solution feed line to thereby sputter said developing solution onto wafers, each located in one of a plurality of process chambers;

a gas removal device installed in said one passage of said second connecting pipe of said developing solution feed line to thereby remove gas contained in said developing solution flowing through said one passage; and a plurality of shut off valves, each installed in said third connecting pipes to thereby open and close said pipes, so that the developing solution can be selectively fed into only one process chamber through one of said plurality of third connecting pipe at a time.

2. The system as claimed in claim 1, wherein if one of said shut off valves is opened, the other shut off valves are automatically closed.

3. The system as claimed in claim 1, further comprising a plurality of control valves installed in said first connecting pipes of said developing solution feed line to thereby selectively open and close said first connecting pipes.

4. The system as claimed in claim 3, wherein said control valves are controlled such that only one valve is opened at a time, and that the one valve to be opened leads to a feed tank having a largest quantity of developing solution.

5. The system as claimed in claim 1, further comprising a filter for removing a foreign substance contained in said developing solution flowing along the developing solution feed line.

6. The system as claimed in claim 5, wherein said filter is installed in said second connecting pipe upstream of the gas removal device.

7. The system as claimed in claim 5, wherein said filter is installed in the second connecting pipe downstream of the gas removal device.

8. The system as claimed in claim 5, wherein said filter is a plurality of filters each installed in said third connecting pipes located between said gas removal device and said shut off valve.

9. The system as claimed in claim 1, further comprising a scale gauge for gauging a quantity of said developing solution flowing through said developing solution feed line.

10. The system as claimed in claim 9, wherein said scale gauge is installed in said second connecting pipe upstream of the gas removal device.

11. The system as claimed in claim 9, wherein said scale gauge is installed in said second connecting pipe downstream of said gas removal device.

12. The system as claimed in claim 9, wherein said scale gauge is a plurality of scale gauges each installed in said third connecting pipes located between said gas removal device and said shut off valve.

* * * * *